United States Patent [19]

Schiller

[11] Patent Number: 5,835,500
[45] Date of Patent: Nov. 10, 1998

[54] ERROR RATE MONITOR

[75] Inventor: Richard Friedrich Schiller, Basingstoke, United Kingdom

[73] Assignee: Sony United Kingdom Limited, Weybridge, United Kingdom

[21] Appl. No.: 538,566

[22] Filed: Oct. 3, 1995

[30] Foreign Application Priority Data

Oct. 28, 1994 [GB] United Kingdom ............... 9421787

[51] Int. Cl.$^6$ .................................................. G06F 11/00
[52] U.S. Cl. ............................................. 371/5.1; 371/5.5
[58] Field of Search .................... 371/5.1, 6.1, 6.2, 371/40.3, 20.1, 20.4, 5.5, 67.1, 68.1; 395/183.1, 183.13, 183.15, 185.01, 185.1, 557; 364/942.7, 927.2, 742.79, 943.9, 950, 942.79

[56] References Cited

U.S. PATENT DOCUMENTS

| | | | |
|---|---|---|---|
| 4,428,076 | 1/1984 | Schuon | 371/5.1 |
| 4,679,195 | 7/1987 | Dewey | 395/183.1 |
| 4,800,562 | 1/1989 | Hicks | 371/5.1 |
| 4,920,537 | 4/1990 | Darling et al. | 371/5.1 |
| 5,138,616 | 8/1992 | Wager, Jr. et al. | 371/5.1 |

FOREIGN PATENT DOCUMENTS

| | | |
|---|---|---|
| 2 260 243 | 4/1993 | United Kingdom . |
| 2 276 297 | 9/1994 | United Kingdom . |

*Primary Examiner*—Trinh L. Tu
*Attorney, Agent, or Firm*—Frommer Lawrence & Haug LLP; William S. Frommer

[57] ABSTRACT

An error rate monitor having means to detect errors in a data stream and a counter for counting the quantity of data or elapsed time between two consecutive errors. The monitor may also caculate running totals of the number of counts falling within each of a plurality of bands of count value. A display shows the running totals as bars on a bar graph, together with two pointers indicating the counted data or time since the previous error and the counted data or time since beginning operation.

12 Claims, 2 Drawing Sheets

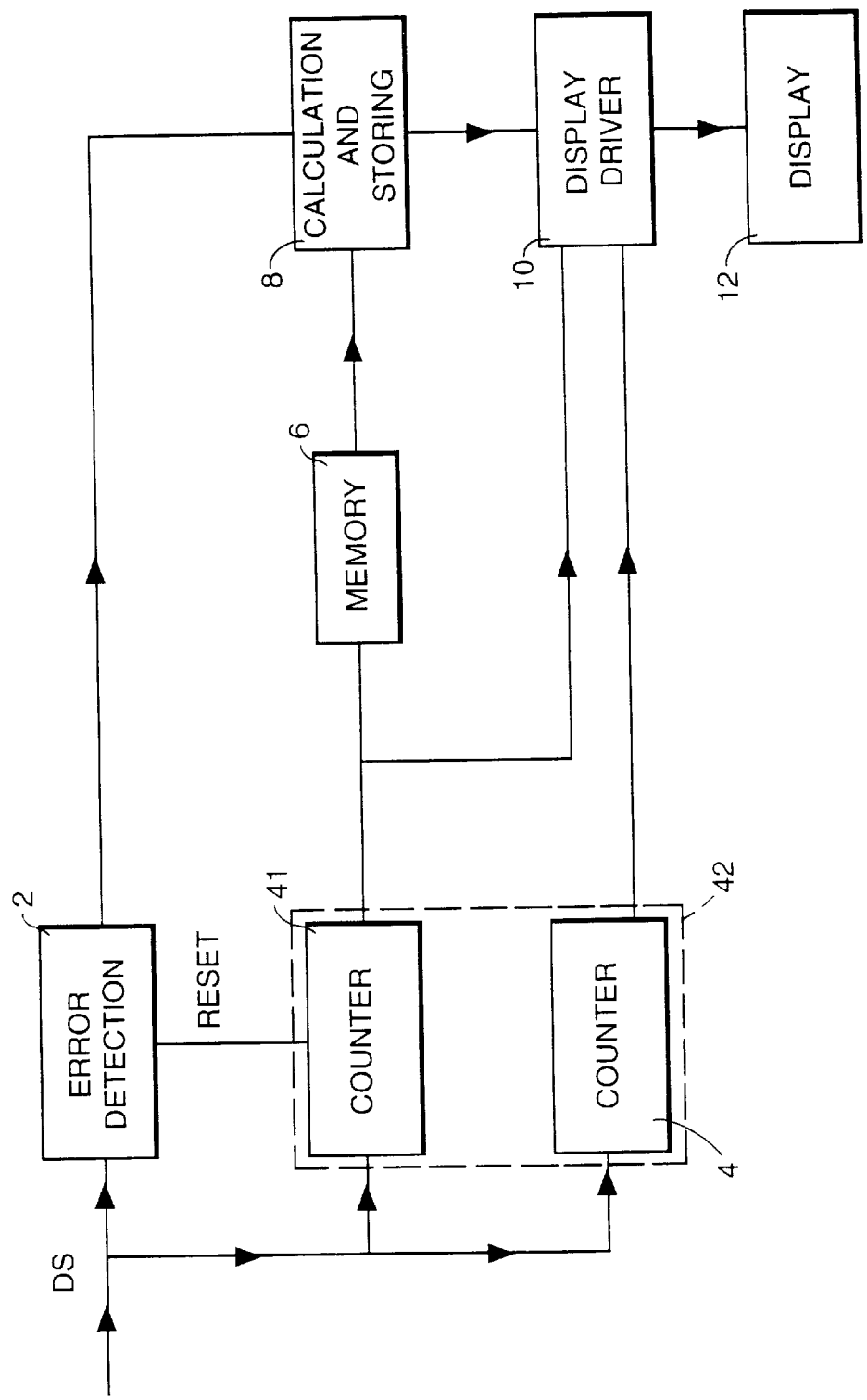

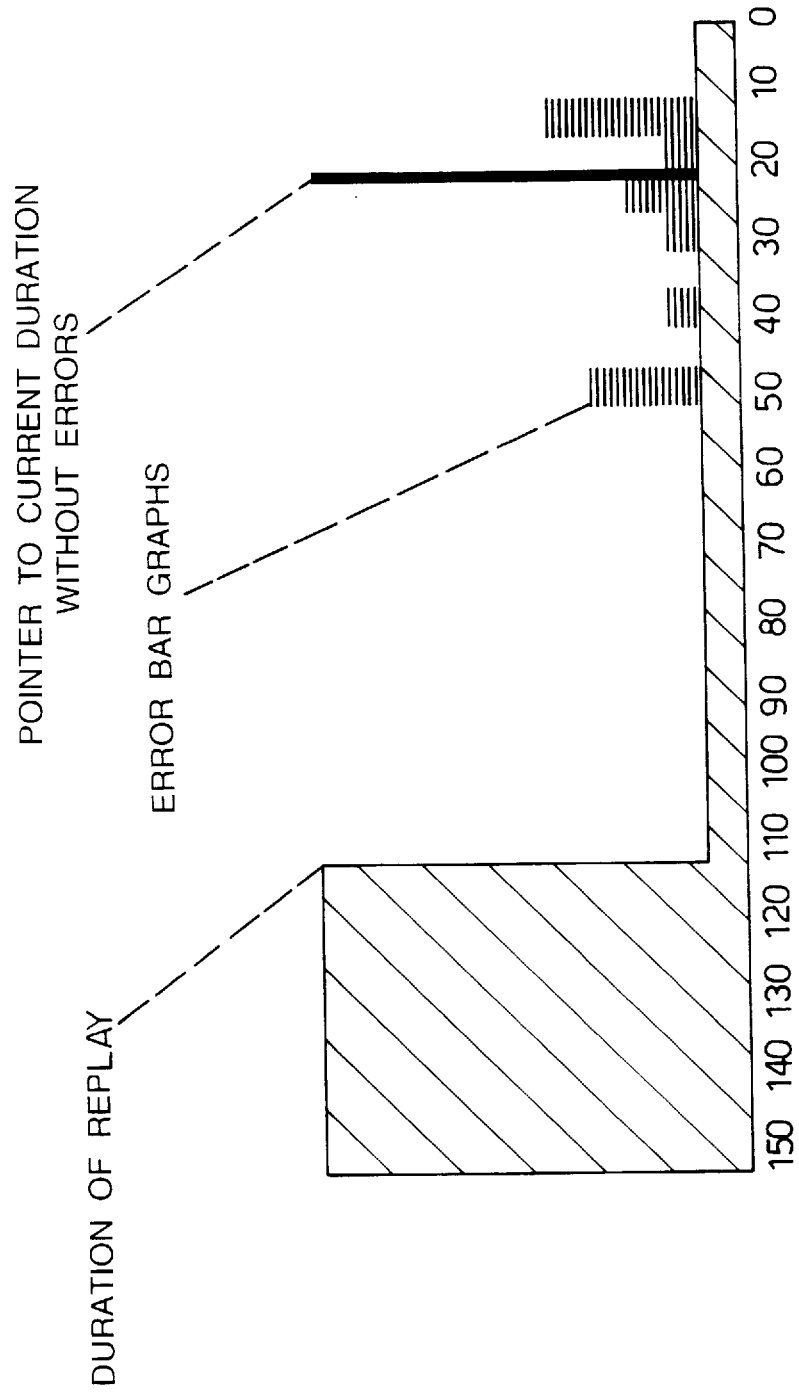

ERROR RATE MONITOR

BACKGROUND OF THE INVENTION

1. Field of the Invention

The present invention relates to an error rate monitor and more particularly to an error rate monitor which displays the number of errors occurring in a data stream.

2. Description of the Related Art

Conventional error rate systems, as used on VTRs and audio tape recorders, count up the errors for a period of time and then display that figure as a fraction. For example, they count the number of errors for one thousand words and then display the result as a fraction, i.e. (Number of errored words/total number of words). Thus, if one sample is in error, the block error rate is $1 \times 10_{-3}$.

The size of the block, that is, the number of words in the divisor of the above expression has two effects. Firstly, the longer the block, the greater the resolution of the block error rate figure, and secondly, the shorter the block, the quicker an error rate may be displayed. However, these two requirements conflict, such that the error rate monitor cannot, at the same time, be both precise and rapidly responsive to the changes in error rate.

An alternative system is to measure the error rate over a number of words, say N, but display the error rate more frequently, i.e. after each new N/k words. In this way, the display is updated k times more often than before. The calculation is still made on N words, such that with each calculation, the N/k oldest words are discarded from the calculation whilst another new N/k words are included.

This system makes a running calculation, but still has the disadvantage that it takes N words before the display is able to show the error rate to a full 1/N precision. Before this time, if any display is to be made, it should indicate that it is of lower resolution. Thus, in essence, either the operator has to wait for the display or is given instant access to a set of figures which are calculated on a different basis than later values.

OBJECTS AND SUMMARY OF THE INVENTION

It is an object of the present invention to provide an error rate monitor which alleviates these problems.

According to the present invention, there is provided an error rate monitoring system for displaying the error rate of a stream of data in which errors can be detected. The system comprises detection means for detecting an error in the data stream and counting means with at least one counter whose count value is progressively changed as data flows in said stream. It also comprises means for resetting the at least one counter in response to detection of an error by said detection means and a display for displaying a representation of a value counted by said at least one counter.

An error rate system according to the present invention is thus capable of almost instant display, yet is able to represent the error rate to the greatest possible precision in any test. As an added advantage, it is more easily able to show cyclic phenomena, hi-lighting defects due to regular recurring conditions.

BRIEF DESCRIPTION OF THE DRAWINGS

FIG. 1 shows a block diagram of a system embodying the present invention; and

FIG. 2 shows a display produced by an embodiment of the present invention.

DETAILED DESCRIPTION OF THE PREFERRED EMBODIMENTS

The present invention will be more clearly understood from the following description, given by way of non-limitative example, with reference to the accompanying drawings.

Referring to FIG. 1, a stream of data DS, for instance from a video or audio tape playback apparatus, is input to an error detection circuit 2 which detects errors in the data stream. The data DS may be of any predetermined form in which error may be inferred and may comprise, for instance bits, bytes, words, etc.

First and second counters 41 and 42 are provided as part of counter 4 and, as illustrated in the present embodiment, also receive the data stream DS so as to count the number of, for instance, data words received. However, counters 41 and 42 may alternatively count elapsed time.

In operation, counter 42 counts the number of words or time elapsed since the system was started up, in other words, since the current test operation was started. However, the counter 41 is reset by the error detection circuit 2 upon detection of an error in the data stream DS. Thus, the counter 41 counts the number of words or time elapsed since the last detected error. This count may be continuously monitored on display 12 via display driver 10.

The calculation and storing circuit 8 is provided to keep a running total of the number of occurrences of each value of the counter 41 when it is reset by the error detection circuit 2. Thus, when the counter 41 is reset, the final count before being reset, i.e. the time elapsed or number of data words between the last two errors, is passed to the calculation and storing circuit 8. This determines in which of a number of bands of count the final count falls, for instance, bands of data numbers 0–99, 100–199, etc or bands of time 0–1 sec, 1–2 sec, etc. It then keeps a running total of how many final counts have occurred in each of the bands since the system was started up.

If necessary and as illustrated in the present embodiment, a memory 6 may be provided so as to briefly store the final count when the counter 41 is reset such that the calculation and storing circuit 8 has time to retrieve that count.

Finally, a display driver 10 receives signals from counters 41 and 42 and the calculation and storing circuit 8 so as to display on the display 12 the counter values and the recorded number of occurrences.

Operation of the system will be further described by reference to FIG. 2 of the accompanying drawings.

The error rate monitor records not "how many errors in a block" but "how long between errors" in terms of time or words. In other words, it records a count for the time between consecutive detected errors. At the start of a measurement, this count is zero and two display pointers, one measuring a count since the last error and one measuring the total count, are both at the zero location. As the test progresses, with no errors having occurred, the pointers move up the scale together. Thus, if one thousand words are input without an error being detected, then both pointers reach the ¹⁄₁₀₀₀ index and, if ten thousand error free words pass the test, then both pointers reach the ¹⁄₁₀₀₀₀ mark.

This situation continues until an error is detected, whereupon the pointers diverge. One of the pointers, i.e. that corresponding to counter 42 showing the maximum resolution of the test so far, continues along the scale. The other of the pointers, i.e. that corresponding to counter 41 indicating the number of words since the last error, is reset to zero to start again its journey along the scale.

Simultaneously with the pointers diverging, according to the embodiment shown in FIG. 2, a bar is drawn orthogonally from the direction of the pointers movement to show that one error has been detected. Its place on the scale then shows that the detected error was separated from the previous error by the number of samples (data words) or the time indicated by its place on the scale.

After a detected error, the pointers then again progress along the scale until the next error. At this time, another bar is placed at the new position of the pointer representing the number of words since the last error. This pointer is then again reset to zero. If this newly added result happens to coincide with the previous value then the bar size is increased by one at that point. In this way, as illustrated in FIG. 2, a bar graph of the distribution of time or samples between errors is drawn.

Thus, one pointer shows the duration of operation, i.e. how long the error monitoring has been running, and thereby shows the best possible performance, of the system under test. In other words, this pointer shows the total time or number of samples that have occurred during the test and therefore shows the total time or number of samples which could have been free from errors; a time or number of samples between errors longer than this total is impossible.

Clearly, this pointer is limited by the length of the scale and cannot show a total time or number of samples beyond the maximum value of the scale. In this regard, it is proposed that a scale is fixed or selected by the operator such that its maximum value is greater than any interval between errors which might be of interest. Alternatively, an autoscaling system could be used such that the scale is changed each time its maximum value is reached. In this way, the resolution of the monitor would be automatically reduced as the test progressed.

The other pointer shows the elapsed time or number of words since the last error, thereby allowing the viewer instant access to the present situation, necessary for adjustments that are error dependant. In the illustrated example, the pointers move right to left in a linear fashion until error monitoring stops, or there is an error. If there is an error, the relevant point resets to the right hand side of the scale.

The bars indicate the number of "time or data between errors" recorded at that value since monitoring started. This type of display allows the balance of errors to be observed. A bar on the right hand side indicates errors occurring in quick succession which may suggest effects such as error propagation. On the other hand, a very tall bar at some later point may indicate a mechanical or repetitive effect and its frequency may show whether, for example on a tape machine, it is caused by a tape reel or a head drum.

Given an equal probability random error distribution, the resultant bar graphs form an approximately triangular display. In view of this, the display may be weighted such that the area beneath the graph is constant for random errors after a given period of measurement (this also makes scaling the display easy). In other words, the weighting is arranged such that one long gap between errors is equivalent to many short ones.

The precise nature of the weighting may be different for different applications. For example, noise is often "pink" rather than "white" and can have a 1/f distribution. In particular, certain applications, for instance certain transmission channels, may have known particular noise characteristics. In these circumstances, the weighting may be adjusted to give a rectangular display for the expected noise distribution, thereby facilitating recognition of abnormal noise.

The horizontal axis which has the scale for counts of data or time can be made logarithmic as well as linear. A logarithmic scale is less useful for maintenance, but is more suitable for an operational display and functions such as tape analysis. In addition, by using a logarithmic scale, the maximum displayed test duration can easily encompass normal tape lengths of for instance 2 hours.

The type of display scale is preferably selectable depending on use.

What is claimed is:

1. An error rate monitoring system for displaying the error rate of a stream of data in which errors can be detected, the system comprising:

an error detection circuit for detecting an error in the data stream;

counting means comprising at least one counter whose count value is progressively changed as data flows in said stream of data, said count value in said at least one counter being reset by a signal generated by said error detection circuit in response to detection of said error;

calculating means arranged to receive the final count of said at least one counter each time said at least one counter is reset, and arranged to calculate running totals of the number of received final counts falling within each of a plurality of bands of count value, the bands comprising one or more values;

means for storing the calculated running totals; and a display for displaying the calculated running totals.

2. A system according to claim 1 wherein said counting means is for counting one of elapsed time and data.

3. A system according to claim 1 wherein the display is arranged to display the calculated running totals on a bar graph, the calculated running totals being displayed as bars arranged along a scale of count values.

4. A system according to claim 3 further comprising:

means for weighting the calculated running totals such that increments of bar length are smaller for bars representing bands of lower count values.

5. A system according to claim 3 wherein the scale of count values is logarithmic.

6. A system according to claim 3 wherein the display is arranged to display said value counted by said at least one counter as a bar which, in use, moves along the scale of count values.

7. A system according to claim 6 further comprising:

means for weighting the calculated running totals such that increments of bar length are smaller for bars representing bands of lower count values.

8. A system according to claim 6 wherein the scale of count values is logarithmic.

9. A system according to claim 1 wherein the display is graphical.

10. A system according to claim 1 wherein the counting means further comprises a further counter for counting one of elapsed time and data from the start of operation of the system.

11. A system according to claim 10 wherein the display is arranged to display a value counted by said further counter along a scale of count values.

12. A method of monitoring and displaying the error rate of a stream of data in which errors can be detected, the method comprising the steps of:

detecting an error in the stream of data;

progressively changing a count value as data flows in said stream of data;

resetting the count value directly in response to said step of detecting said error in the stream of data;

receiving the final count in response to said step of resetting the count value each time;

calculating running totals of the number of received final counts falling within each of a plurality of bands of count value, the bands comprising one or more values;

storing the calculated running totals; and displaying the calculated running totals.

* * * * *